(12) United States Patent
Ok et al.

(10) Patent No.: US 10,803,933 B2
(45) Date of Patent: Oct. 13, 2020

(54) SELF-ALIGNED HIGH DENSITY AND SIZE ADJUSTABLE PHASE CHANGE MEMORY

(71) Applicant: International Business Machines Corporation, Armonk, NY (US)

(72) Inventors: Injo Ok, Loudonville, NY (US); Myung-Hee Na, Lagrangeville, NY (US); Nicole Saulnier, Slingerlands, NY (US); Balasubramanian Pranatharthiharan, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/107,129

(22) Filed: Aug. 21, 2018

(65) Prior Publication Data
US 2020/0066337 A1 Feb. 27, 2020

(51) Int. Cl.
*G11C 13/00* (2006.01)
*H01L 45/00* (2006.01)
*H01L 27/24* (2006.01)

(52) U.S. Cl.
CPC ...... *G11C 13/0004* (2013.01); *H01L 27/2445* (2013.01); *H01L 45/06* (2013.01); *H01L 45/1246* (2013.01); *H01L 45/146* (2013.01); *H01L 45/1625* (2013.01); *H01L 45/1675* (2013.01)

(58) Field of Classification Search
CPC .................................................. H01L 27/2445
See application file for complete search history.

(56) References Cited

U.S. PATENT DOCUMENTS

| | | |
|---|---|---|
| 5,825,046 A | 10/1998 | Czubatyj et al. |
| 7,324,365 B2 | 1/2008 | Gruening-von Schwerin et al. |
| 7,422,926 B2 | 9/2008 | Pellizzer et al. |
| 7,892,936 B1 | 2/2011 | Wu et al. |
| 8,030,128 B1 | 10/2011 | Sutardja et al. |
| 8,395,935 B2 | 3/2013 | Lung et al. |
| 9,318,700 B2 | 4/2016 | Wu et al. |
| 9,490,299 B2 | 11/2016 | Lee et al. |
| 9,590,012 B2 | 3/2017 | Lee et al. |

(Continued)

OTHER PUBLICATIONS

Cheng et al., "Atomic-level Engineering of Phase Change Material for Novel Fast-switching and High-endurance PCM for Storage Class Memory Application," IEEE International Electron Devices Meeting (IEDM), Dec. 9-11, 2013, Washington, DC, 4 pages.

(Continued)

*Primary Examiner* — Seahvosh Nikmanesh
(74) *Attorney, Agent, or Firm* — Yee & Associates, P.C.

(57) ABSTRACT

A method of forming a self-aligned phase change memory element is provided. A bottom electrode is formed on a landing pad of a phase change memory element. A layer of dielectric material over the bottom electrode and a via etched through the dielectric material to expose the bottom electrode. The via is lined with a GST phase change layer that is etched back from the top surface of the dielectric layer. The via is then filled with a nitride fill, at least of portion of which is etched back from the top surface of the dielectric layer. A top electrode metal is then deposited at the top of the via, wherein the top electrode material is coupled to the phase change material and nitride fill material.

10 Claims, 7 Drawing Sheets

(56) References Cited

U.S. PATENT DOCUMENTS 9,640,757 B2 5/2017 Zheng
2013/0336046 A1* 12/2013 Oh .......................... H01L 45/04
365/163

OTHER PUBLICATIONS

Kim et al., "A Phase Change Memory Cell with Metallic Surfactant Layer as a Resistance Drift Stabilizer," IEEE International Electron Devices Meeting (IEDM), Dec. 9-11, 2013, Washington, DC, 4 pages.
Brightsky et al., "Crystalline-as-Deposited ALD Phase Change Material Confined PCM Cell for High Density Storage Class Memory," IEEE International Electron Devices Meeting (IEDM), Dec. 7-9, 2015, Washington, DC, 4 pages.
Raoux et al., "Phase Change Materials and Phase Change Memory," Material Research Society (MRS) Bulletin, vol. 39, Aug. 2014, pp. 703-710.

* cited by examiner

SELF-ALIGNED HIGH DENSITY AND SIZE ADJUSTABLE PHASE CHANGE MEMORY

BACKGROUND

1. Field

The disclosure relates generally to integrated circuit devices and associated fabrication techniques, and more specifically to a phase change memory device and associated fabrication of such phase change memory device.

2. Description of the Related Art

Resistive memory is a type of non-volatile memory that utilizes the resistance value of a memory element to store one or more bits of data. For example, a memory element programmed to have a high resistance value may represent a logical '1' data bit value, whereas a memory element programmed to have a low resistance value may represent a logical '0' data bit value. A voltage pulse or a current pulse is applied to the memory element in order to electrically switch the resistance value of the memory element.

Phase change materials that exhibit at least two states are used in phase change memory cells to store bits of data, where the states of the phase change material are sometimes referred to as amorphous and crystalline states. The amorphous state generally exhibits higher resistivity than does the crystalline state. Phase change in the phase change materials may be induced reversibly, allowing a given memory element to change between the amorphous state to the crystalline state and from the crystalline state to the amorphous state in response to temperature changes. Controllable heating of the phase change material, which occurs by driving a current through the phase change material or feeding a current through a resistive heater adjacent the phase change material, causes controllable phase change within the phase change material.

A phase change memory (PCM) that contains a memory array having memory cells that are made of phase change material may be programmed to store data utilizing the memory states of the phase change material by controlling a current and/or voltage pulse that is applied to the phase change material, where the level of current/voltage corresponds to the temperature induced within the phase change material in each memory cell of the memory array.

In the continuing quest to reduce memory cell size for data storage applications, the memory cell layout is preferably lithography friendly during the fabrication process. However, certain materials used in the fabrication process may have certain adverse characteristics when using a dry etching process such as reactive ion etching (RIE), making deposition in high profile vias difficult.

SUMMARY

A method of forming a self-aligned phase change memory element is provided. A bottom electrode is formed on a landing pad of a phase change memory element. A layer of dielectric material over the bottom electrode and a via etched through the dielectric material to expose the bottom electrode. The via is lined with a GST phase change layer that is etched back from the top surface of the dielectric layer. The via is then filled with a nitride fill, at least of portion of which is etched back from the top surface of the dielectric layer. A top electrode metal is then deposited at the top of the via, wherein the top electrode material is coupled to the phase change material and nitride fill material.

DETAILED DESCRIPTION

Aspects of the present invention are described herein with reference to diagrams of methods and apparatuses according to embodiments of the invention. The diagrams in the Figures illustrate the architecture and operation of possible implementations methods according to various embodiments of the present invention.

Figure 1:
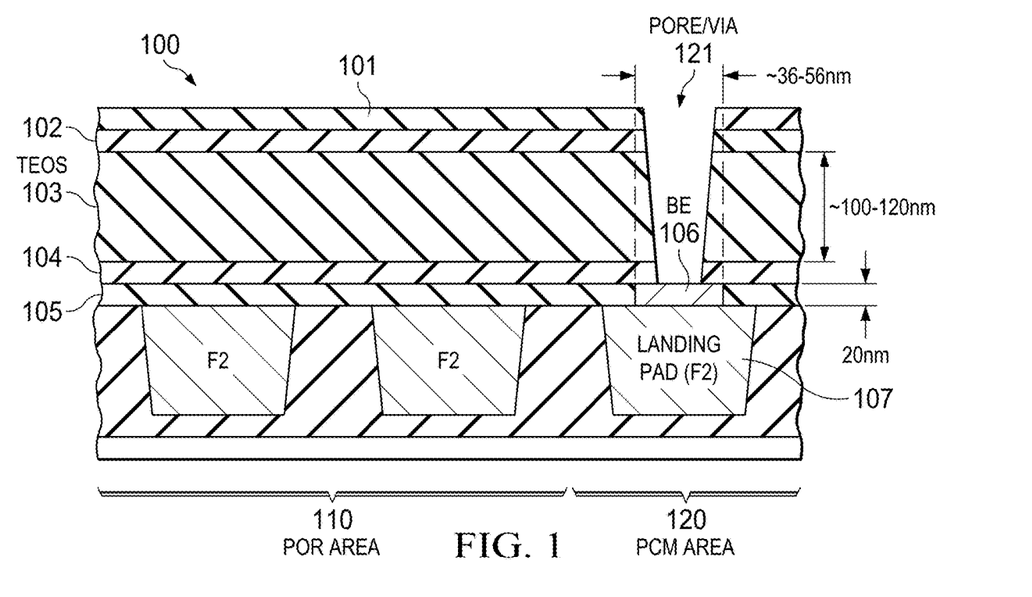
FIG. 1, there is depicted at 100 an intermediate state of a component associated with a fabrication process used to form a data storage device comprising an array of phase-control memory (PCM) elements in which illustrative embodiments can be implemented.

With reference to FIG. 1, there is depicted at 100 an intermediate state of a component associated with a fabrication process used to form a data storage device comprising an array of phase-control memory (PCM) elements in which illustrative embodiments can be implemented. The component 100 is divided into a power on reset (POR) area 110 and a PCM area 120. A representative, partially formed PCM element is shown in the PCM area 120. The PCM area 120 has a pore/via 121 that extends through several layers to a bottom electrode (BE) 106. The via 121 forms a path between the BE 106 and a top electrode that will eventually be added (see below) and is etched using standard methods in the art such as reactive-ion etching (RIE).

The first layers through which the via passes are the TiN hard mask 101 and SiN sacrificial layer 102, both approximately 25 nm thick. These layers protect the low-k dielectric (surface) during pore/via RIE and the following RIE ash process. The next layer is the layer of Low-k or tetraethoxysilane (TEOS) material 103 approximately 100-120 nm thick. Below that is layer approximately 30 nm thick of NBLOK (Nitrogen-containing Block Low-k) 104, a low-k barrier/etch stop silicon carbide film.

BE 106 is made of TaN and is approximately 20 nm thick and 36-56 nm wide. It is formed on top of landing pad 107 and is within a layer of 400 C SiN 105 that is approximately 20 nm thick as well.

A preferred material for use in PCM devices is GeSbTe (GST). However, the high aspect ratio of the PCM via shown in FIG. 1 makes GST deposition very difficult in such a small pore. In illustrative embodiments, the pore/via 121 can have a width as small as 28 nm to accommodate a replacement metal gate (RMG). The present disclosure provides a method and structure of a confined GST cell that allows better productivity with physical vapor deposition (PVD) sputtering of GST within the 28 nm process scheme.

Figure 2A:
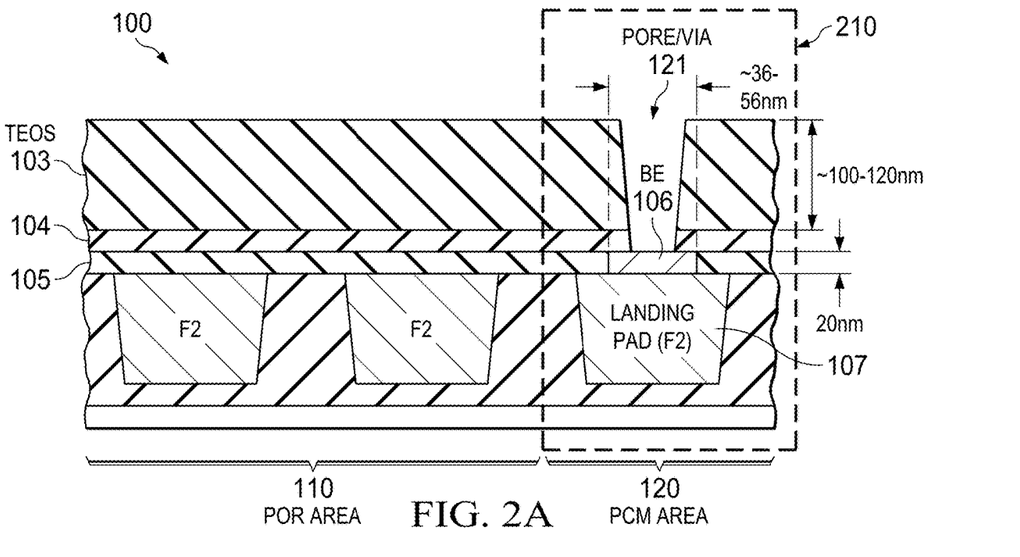
FIGS. 2A-2B depict the structure 100 of FIG. 1 after removal of the hard mask.
Figure 2B:
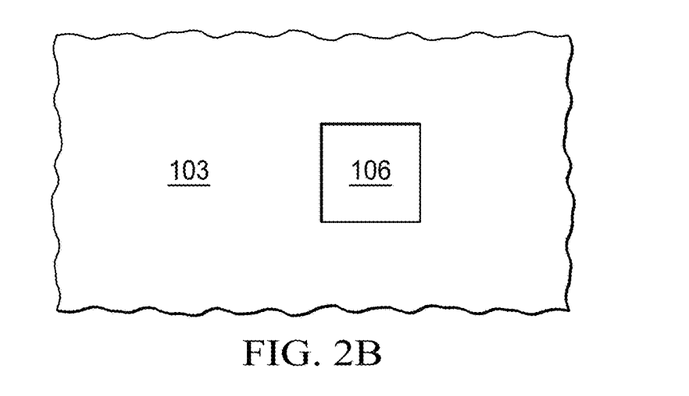

FIGS. 2A-2B depict the structure 100 of FIG. 1 after removal of the hard mask. After RIE pore etching to create the structure in FIG. 1, wet etching is used to remove hard mask TiN 101 and SacSiN 102. TETCH can be used to remove TiN, and dilute hydrofluoric acid (DHF) can be used to remove the SacSiN. The PCM area 120 that is highlighted in FIG. 2A by the dotted rectangle 210 is shown in detail in the figures below. FIG. 2B shows the top plan view with the BE visible through the PCM via. In this illustrative embodiment, the PCM via is square in shape. However, other geometric configurations are possible, as explained below.

Figure 3:
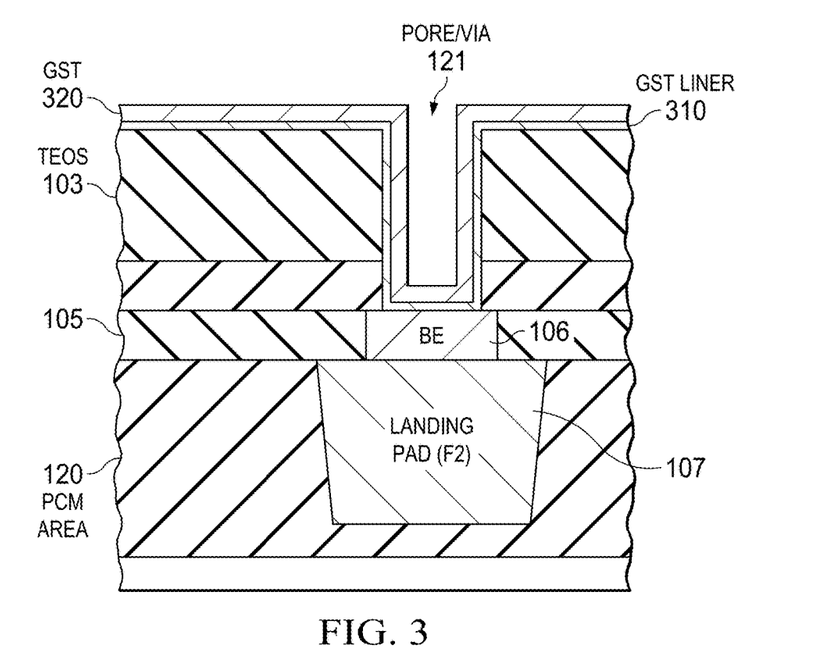
FIG. 3 shows the PCM area after GST deposition.

FIG. 3 shows the PCM area after GST deposition. A metal liner 310 is deposited along the surface of the Low-k/TEOS layer 103, the walls of the pore/via 121, and top of the BE 106. Subsequently a GST layer 320 is deposited over the metal liner by PVD sputtering. The metal liner 310 improves PCM memory reliability.

Figure 4:
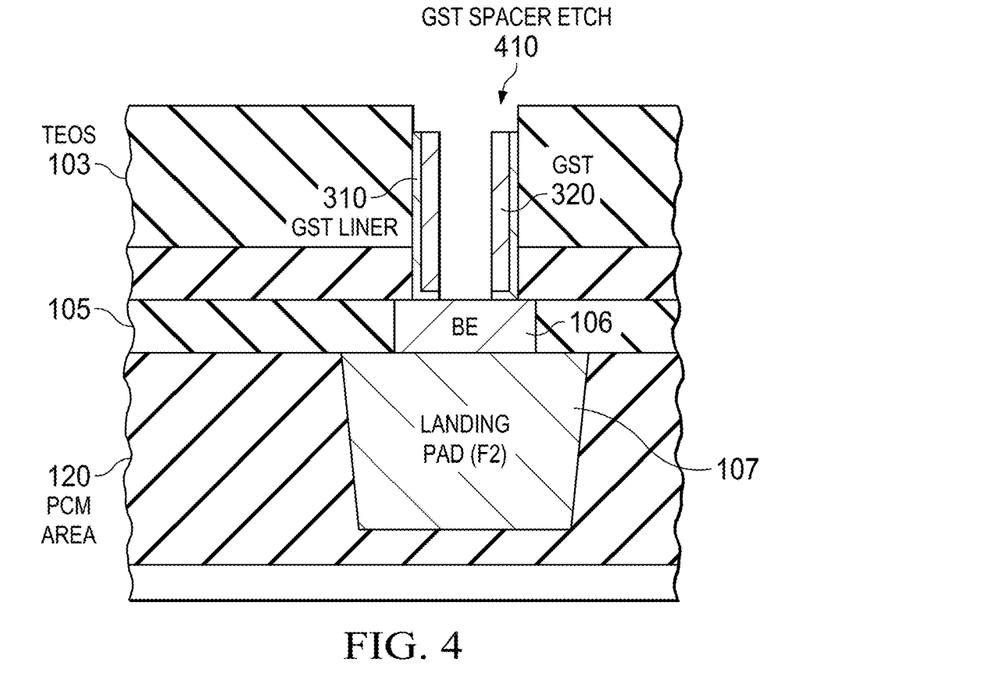
FIG. 4 shows the PCM area after etching of the GST layer.

FIG. 4 shows the PCM area after etching of the GST layer. After PVD deposition of the GST layer 320 the metal liner and GST are removed from the surface of the TEOS layer 103 and part of the surface of the BE 106, leaving the metal liner and GST layer along the walls of the pore/via. Chemical mechanical polishing (CMP) can be used to remove all of the GST and metal liner on top of Low-k/TEOS layer and above the via that extends above the top surface of Low-k/TEOS layer.

The metal liner and GST layer are also partially etched back from the top surface of the TEOS layer, leaving a space etch 410 at the top of the pore/via. This spacer etching of the GST can be accomplished using RIE or selective wet etching. The thickness of the remaining GST layer 320 along the walls of the pore/via can be adjusted by either depositing more GST during PVD sputtering or etching back more during the spacer etch. The spacer etching of the GST eliminates the need for CMP and eliminates overhang at the top if multiple depositions and spacer etches are performed.

Figure 5:
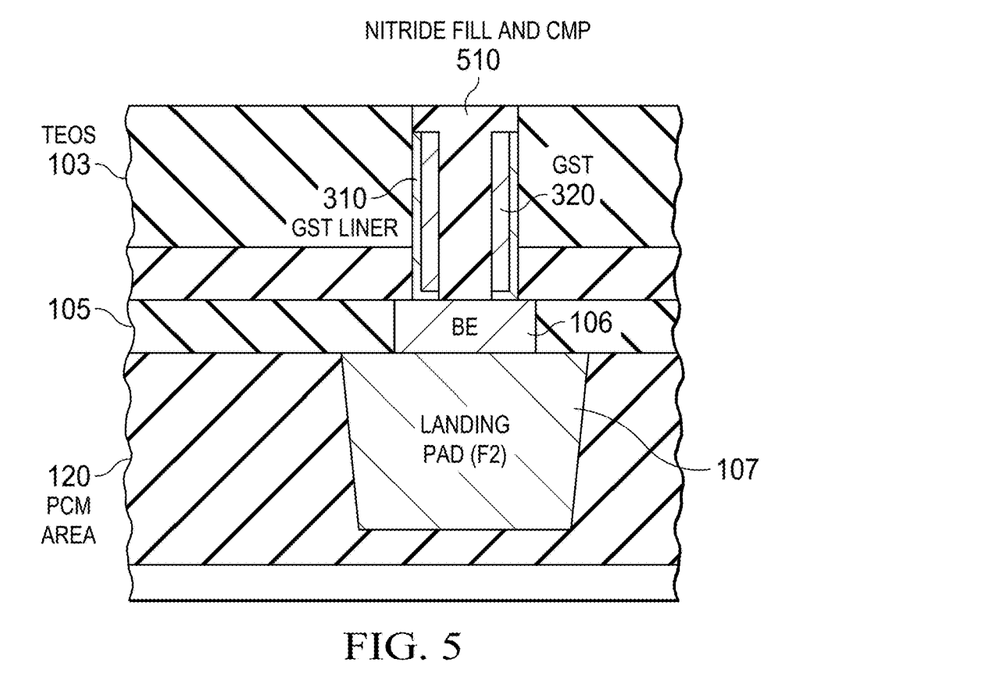
FIG. 5 show the PCM area after filling the pore/via.

FIG. 5 show the PCM area after filling the pore/via. After the etching of the GST layer, the remaining space in the pore/via is filled with a nitride 510, and CMP planarizes the nitride with the surface of the TEOS layer 103.

Figure 6:
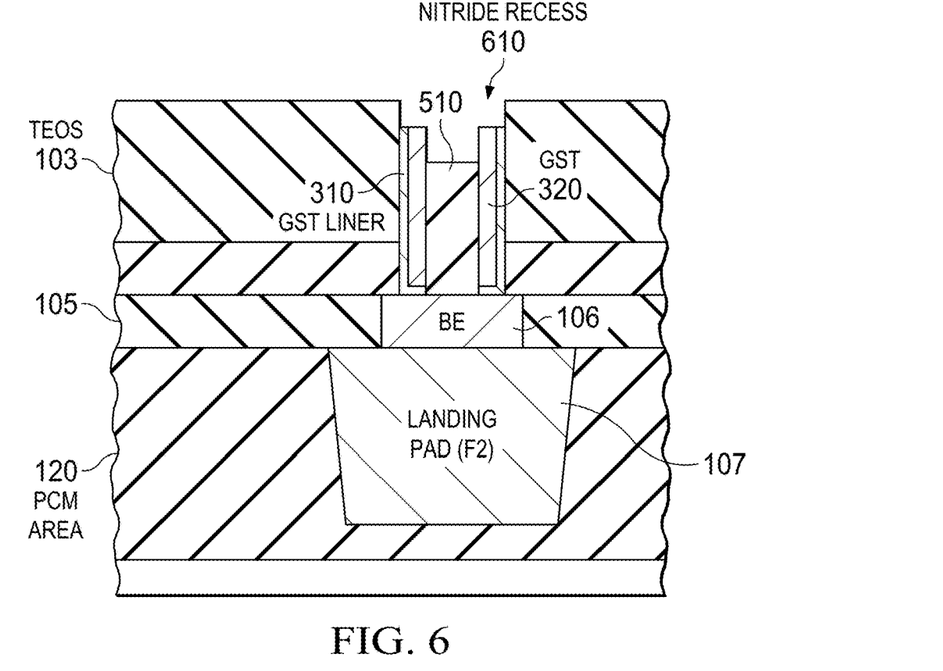
FIG. 6 shows the PCM area after etching of the nitride fill in the pore/via.

FIG. 6 shows the PCM area after etching of the nitride fill in the pore/via. After CMP, the nitride 510 is selectively recessed. Again, this can be accomplished with RIE or selective wet etching. In the illustrative embodiment shown the nitride recess 610 is below the top of the GST layer 320.

Figure 7:
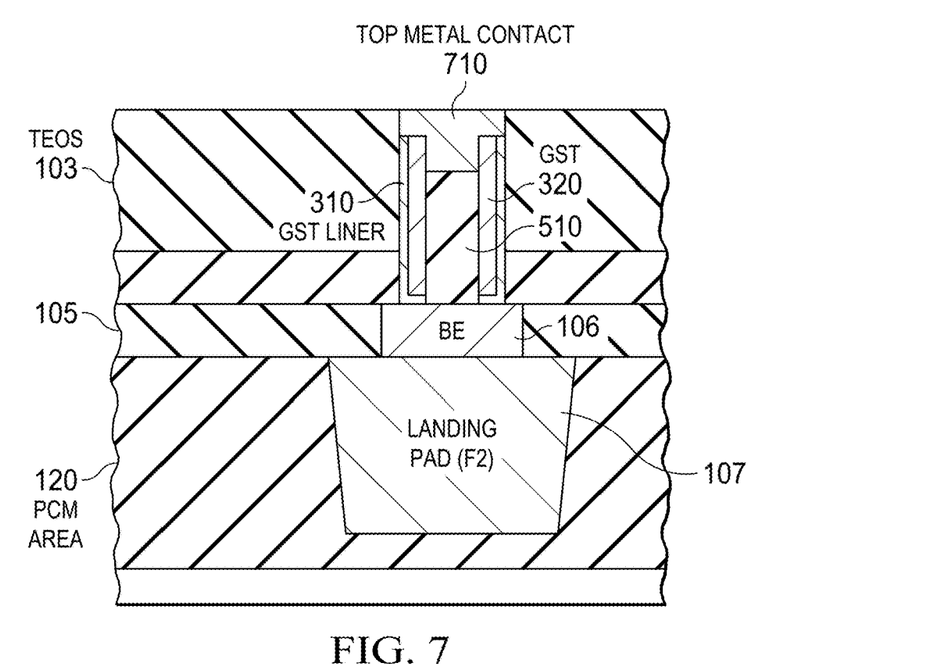
FIG. 7 shows the PCM area after addition of the top electrode.

FIG. 7 shows the PCM area after addition of the top electrode. The top metal contact 710 is deposited in the space left by the spacer etch of the GST layer and the recessing of the nitride and then planarized with the TEOS layer 103 by CMP. Like the BE, the top electrode 710 can be made from TaN or similar metal (e.g., TiN).

Figure 8:
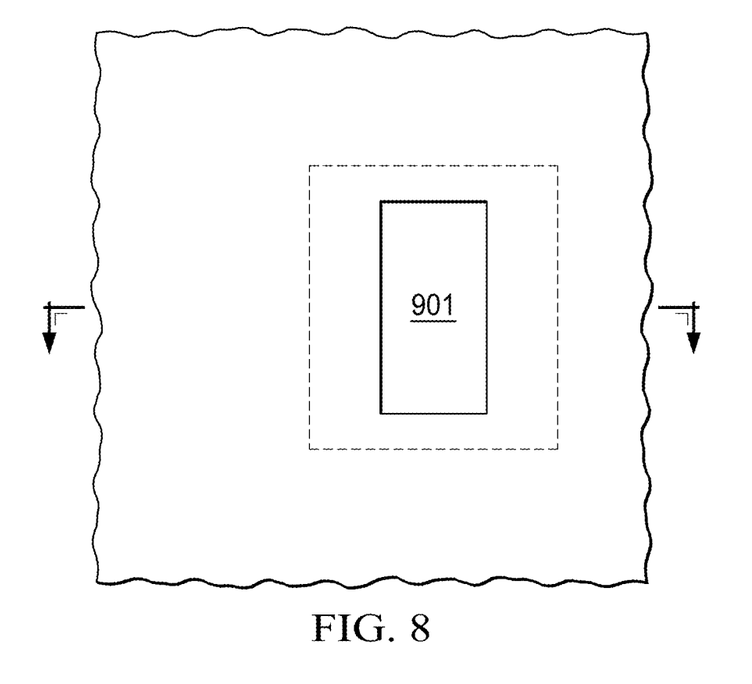
FIG. 8 shows a top plan view of a CMP area in accordance with alternate illustrative embodiment having a trench via.

FIG. 8 shows a top plan view of a CMP area in accordance with alternate illustrative embodiment having a trench via. In this embodiment, the bottom electrode 901 is rectangular, and the PCM via is etched as a trench, rather than square as shown in FIG. 2B.

Figure 9A:
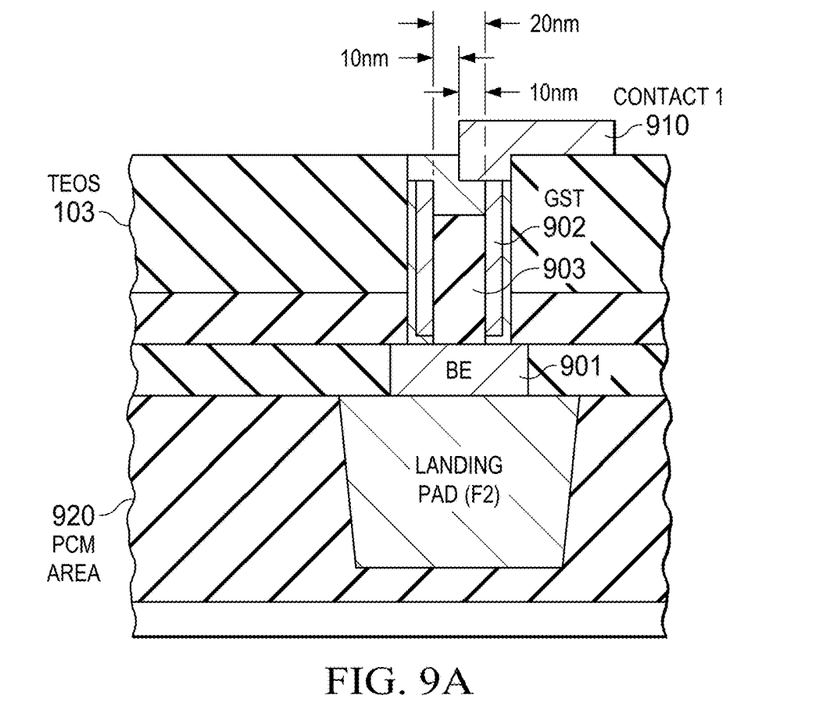
FIGS. 9A-9B show the alternate CMP area after the nitride fill and addition of a top contact.
Figure 9B:
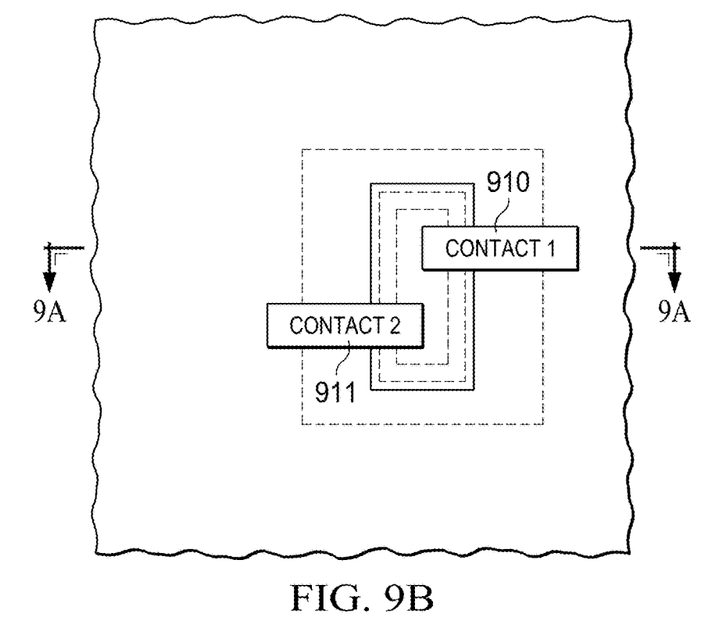

FIGS. 9A-9B show the alternate CMP area after the nitride fill and addition of a top contact. Because of the rectangular configuration of the BE 901 and via trench, two top electrodes 910, 911 can be added, as shown in the top plan view of FIG. 9B. In the cross-section view of FIG. 9A, only one top electrode 910 is depicted for ease of illustration.

In this illustrative embodiment the metal contact overlay is carefully controlled. As shown in FIG. 9A, the thickness of the GST layer 902 is approximately 10 nm thick. To allow an equal 10 nm overlay of the top metal contact over the nitride fill 903 the GST-to-GST distance in the via is greater than 20 nm. As shown in FIG. 9B, the top electrodes 910, 911 are offset from each other to avoid contact.

Figure 10:
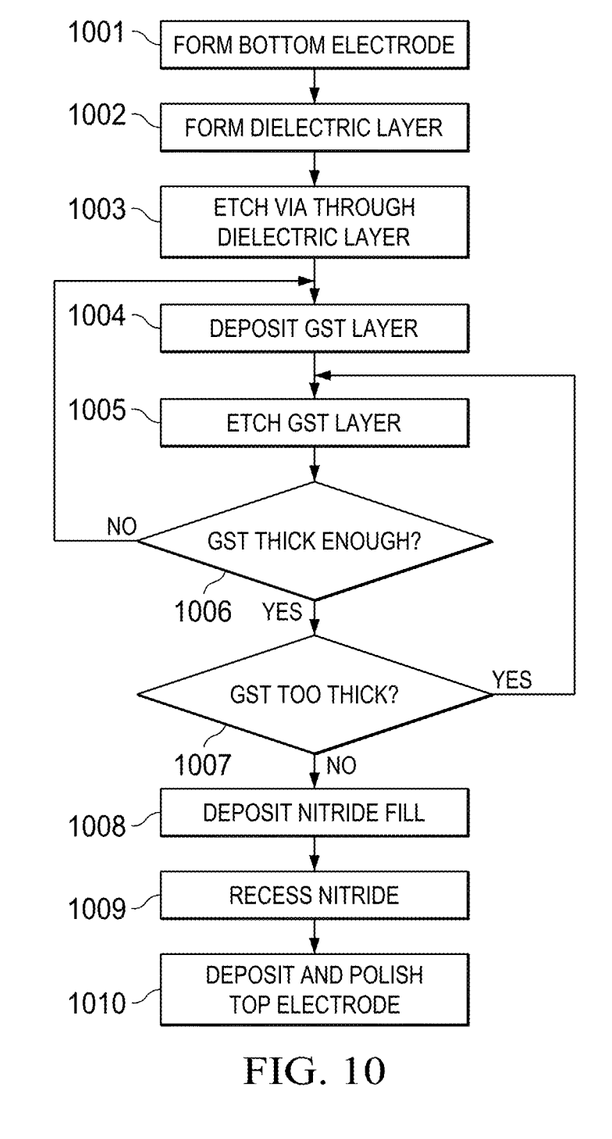
FIG. 10 is a flowchart illustrating a process flow for forming a PCM element in which the illustrative embodiments can be implemented.

FIG. 10 is a flowchart illustrating a process flow for forming a PCM element in which the illustrative embodiments can be implemented. The process begins by forming the bottom electrode in the SiN layer on the landing pad (step 1001). The dielectric TEOS layer is then formed over the bottom electrode and SiN layer (step 1002), and then the pore/via is etched through the dielectric layer to produce the structure shown in FIGS. 1 and 2 (step 1003).

After the hard mask is removed, the metal liner and GST layer are deposited as shown in FIG. 3 (step 1004). The GST is then etched back to produce the spacer etch shown in FIG. 4 (step 1005).

The thickness of the GST can be adjusted as necessary. If the GST layer is not thick enough another deposition of GST is performed (step 1006). If the GST layer is too thick, the GST is etched again (step 1007). GST deposition and etching is repeated until the specified thickness of the GST layer is achieved.

Then nitride fill is then deposited in the via as shown in FIG. 5 (step 1008) and then recessed below the TEOS top surface, resulting in the structure in FIG. 6 (step 1009). In the case of the square via, the nitride can be etched below the top of the GST layer as shown in FIG. 7. If the via trench embodiment is formed with the two top electrodes, the nitride fill is recessed to accommodate the top electrodes, but the areas of the nitride not overlain by the top electrode metal is planarized with the top surface of the dielectric layer as shown in FIG. 9A.

The top electrode metal is then deposition over the top of the via (step 1010). If a single top electrode is formed, as in FIG. 7, the top electrode metal is planarized with the dielectric layer.

Figure 11:
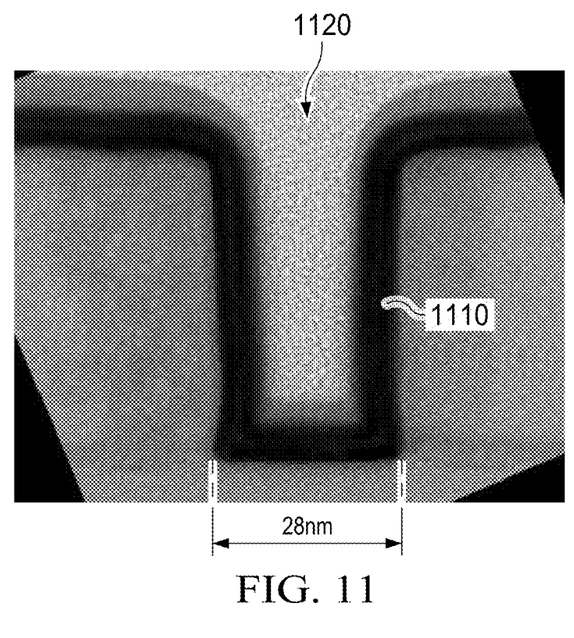
FIG. 11 depicts a cross section of a 28 nm replacement metal gate (RMG) formed using the methods of the present disclosure.

FIG. 11 depicts a cross section of a 28 nm replacement metal gate (RMG) formed using the methods of the present disclosure. This figure is based on an electron microscope image of the RMG. Shown are the GST layer 1110 and the nFET high-k/nitride metal fill 1120.

The new process scheme of the present disclosure provides better productivity with PVD sputtering of GST. Spacer etching of the PVD GST material provides the advantage with no CMP and elimination the overhang at the top if multiple PVD depositions and spacer etching is used. The spacer etch of the GST material and BE followed by encapsulating material deposition provides double density of the device, thereby doubling data storage capability. Providing the GST metal liner can also improve PCM memory reliability.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change memory element, comprising:
a bottom electrode coupled to a landing pad of the phase change memory element;
a dielectric layer formed over the bottom electrode and landing pad, wherein the dielectric layer further comprises a via from a top surface of the dielectric layer to the bottom electrode;
a layer of phase change material deposited along the walls of the via, wherein the phase change material comprises a bottom coupled to the bottom electrode and a top that is recessed from the top surface of the dielectric layer at the top of the via;
a nitride material filling the via, wherein the nitride material comprises a bottom coupled to the bottom electrode and a top that is recessed from the top surface of the dielectric layer at the top of the via; and
a top electrode metal formed at the top of the via, wherein the top electrode metal is coupled to the phase change material and the nitride material.

2. The memory element of claim 1, wherein the phase change material comprises GeSbTe.

3. The memory element of claim 1, further comprising a metal liner between the walls of the via and the phase change material.

4. The memory element of claim 1, wherein the via has a width of 28 nm.

5. The memory element of claim 1, wherein the via has a depth of 100-150 nm.

6. The memory element of claim 1, wherein the via is a rectangular trench.

7. The memory element of claim 6, wherein the top electrode metal comprises two separate electrodes.

8. The memory element of claim 7, wherein the layer of phase change material has a thickness of 10 nm, wherein the distance between phase change material on opposite walls of the via is greater than 20 nm, and therein each top electrode overlays the nitride material filling the via by 10 nm.

9. The memory element of claim 1, wherein the top of the nitride material is recessed below the top of the phase change material in the via.

10. The memory element of claim 1, wherein the bottom electrode and top electrode metal comprise TaN.

* * * * *